US006980052B1

(12) United States Patent
Stroet

(10) Patent No.: US 6,980,052 B1
(45) Date of Patent: Dec. 27, 2005

(54) LOW-VOLTAGE PRE-DISTORTION CIRCUIT FOR LINEAR-IN-DB VARIABLE-GAIN CELLS

(75) Inventor: Petrus Martinus Stroet, Santa Cruz, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/637,714

(22) Filed: Aug. 8, 2003

(51) Int. Cl.[7] .................................................. H03F 3/45
(52) U.S. Cl. ........................ 330/254; 330/256; 330/289
(58) Field of Search ................................ 330/254, 256, 330/289

(56) References Cited

U.S. PATENT DOCUMENTS 5,471,173 A 11/1995 Moore et al.
5,790,943 A 8/1998 Fotowat-Ahmady et al.
5,994,961 A * 11/1999 Lunn et al. ................. 330/254
6,442,380 B1 8/2002 Mohindra
6,583,667 B1 * 6/2003 Dasgupta et al. ........... 330/254
6,721,548 B1 4/2004 Mohindra et al.
6,724,235 B2 * 4/2004 Costa et al. ................ 330/254
6,791,416 B2 * 9/2004 Kipnis et al. ............... 330/278
6,804,499 B2 10/2004 Khosrowbeygi et al.
2002/0146991 A1 10/2002 Khosrowbeygi et al.
2002/0146992 A1 10/2002 Khosrowbeygi
2004/0161030 A1 8/2004 Mohindra et al.

OTHER PUBLICATIONS

Shoji Otaka et al., "A Low-Power Low-Noise Accurate Linear-in-dB Variable-Gain Amplifier with 600-MHz Bandwidth", IEEE Journal of Solid-State Circuits, vol. 95, No. 12, Dec. 2000.

* cited by examiner

*Primary Examiner*—Khanh V. Nguyen
(74) *Attorney, Agent, or Firm*—Townsend and Townsend and Crew LLP

(57) ABSTRACT

Circuits and methods for a low voltage pre-distortion circuits that provide a temperature and logarithmically compensated voltage such that a gain change of a variable gain amplifier is linear in dB and has a reduced temperature dependency. A temperature compensation circuit multiplies the transfer function of gain of the amplifier versus gain control voltage by absolute temperature. A logarithmic compensation circuit removes the non-logarithmic factor of a "1" in the denominator of the transfer function.

16 Claims, 7 Drawing Sheets

LOW-VOLTAGE PRE-DISTORTION CIRCUIT FOR LINEAR-IN-DB VARIABLE-GAIN CELLS

CROSS-REFERENCES TO RELATED APPLICATIONS

This application is related to U.S. patent application Ser. No. 10/637,747, titled A LOW-VOLTAGE HIGH DYNAMIC RANGE VARIABLE-GAIN AMPLIFIER, filed Aug. 8, 2003 by Petrus Stroet, which is incorporated by reference.

BACKGROUND

The present invention relates to amplifiers for integrated circuits, particularly to variable-gain amplifiers.

Variable-gain amplifiers are useful in applications such as RF receivers where a fixed output voltage level is desirable, but the signal strength of an input signal varies. If a received signal is weak, a variable-gain amplifier should gain the signal to the desired output level, when the received signal is strong, the gain should be lowered.

The gain is varied by a control voltage such that a change in control voltage results in a change in the amplifier gain. Unfortunately, this change in gain as a function of control voltage is typically nonlinear and temperature dependent. This makes the setting of the control voltage more difficult because a step in the Digital-to-Analog converter that steers the Variable-Gain-Amplifier does not correspond to a fixed dB value. Also, the resulting gain is a function of temperature, which results in a gain drift.

Any attempt to improve the linearity and temperature drift of the amplifier gain is complicated by the trend towards lower operating voltages. This trend has been driven by a desire for lower power supply dissipation, longer battery life in mobile devices, and the use of smaller geometry devices. Voltage supplies, while plus and minus 15 volts many years ago, were lowered to 5 volts, then 3.3 volts, and are now at 1.8 volts. These voltages are certain to be reduced again in the future. Designing high performance circuits that can operate at these lower voltages requires innovation, particularly in circuits made using a bipolar process, since transistor base-to-emitter voltages have not correspondingly reduced along with supply voltage.

Thus, what is needed is a variable-gain amplifier that has a gain versus control voltage response that is linear in dB and is temperature independent and operates properly at these lower voltages.

SUMMARY

Accordingly, an exemplary embodiment of the present invention provides a low voltage pre-distortion circuit that provides a temperature and logarithmically compensated voltage such that a gain change of a variable gain amplifier is linear in dB and has a reduced temperature dependency.

A specific embodiment of the present invention provides a variable gain amplifier having amplifier and pre-distortion circuits. The pre-distortion circuit includes a first circuit for temperature compensating a control signal, and a second circuit for logarithmically compensating the control signal. These two compensations may be done in either order or in parallel. The circuits are carefully designed for operation at low voltages.

A better understanding of the nature and advantages of the present invention may be gained with reference to the following detailed description and the accompanying drawings.

BRIEF DESCRIPTION OF THE DRAWINGS

FIGS. 4A and 4B are schematics of voltage-to-current converters that may be used as the voltage-to-current converter in FIG. 3, while

FIG. 8A is a schematic of the buffer amplifier that may be used as the buffer amplifier in FIG. 5 or as a buffer amplifier in other embodiments of the present invention, while

DESCRIPTION OF EXEMPLARY EMBODIMENTS

Figure 1:
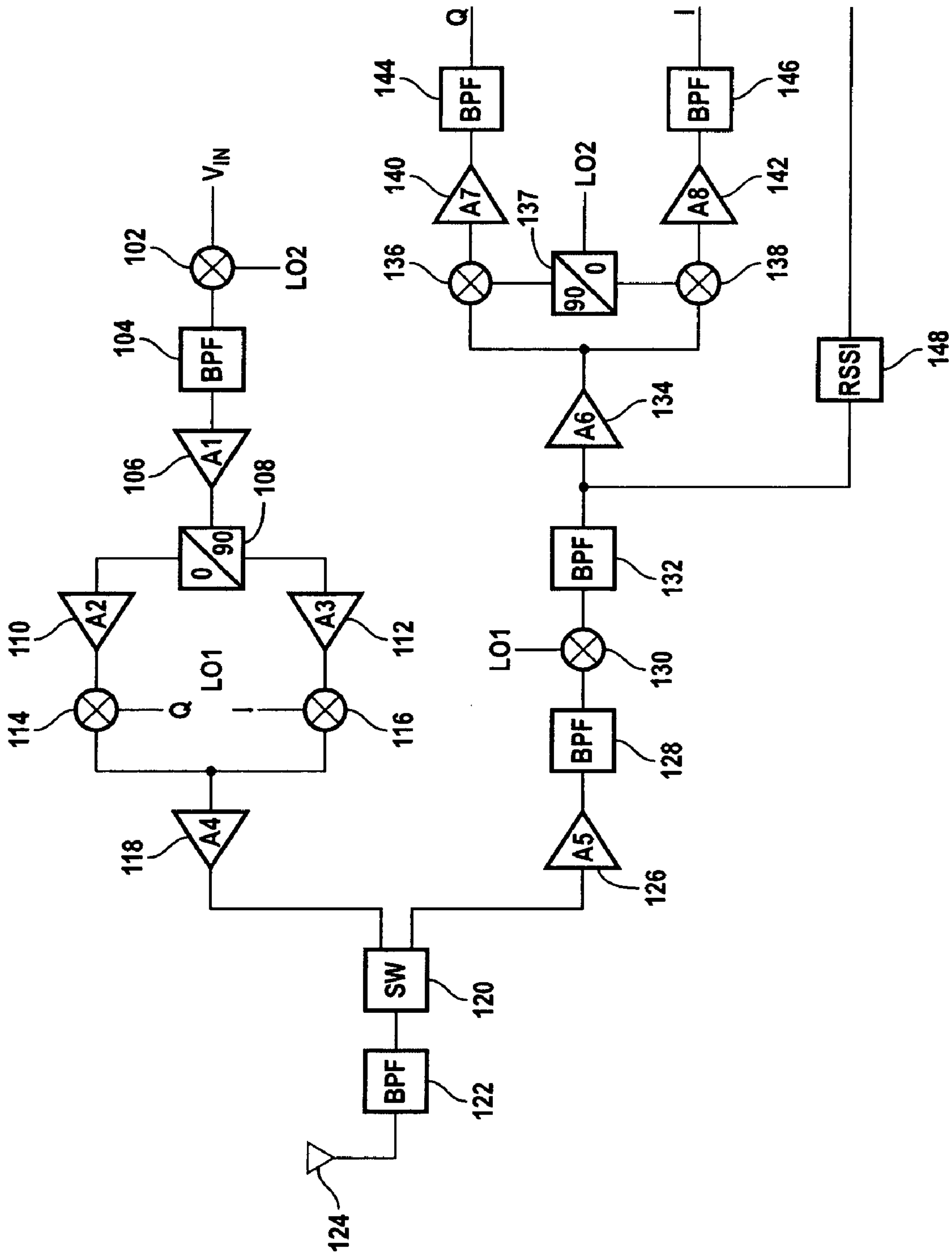
FIG. 1 is a block diagram of a portion of a transceiver that may be benefited by inclusion of embodiments of the present invention.

FIG. 1 is a block diagram of a portion of a transceiver that may be benefited by inclusion of embodiments of the present invention. Shown are a transmitter including mixer 102, bandpass filter 104, amplifier 106, phase splitter 108, amplifiers 110 and 112, I and Q mixers 114 and 116, and power amplifier 118, and a receiver including low noise amplifier (LNA) 126, bandpass filter 128, mixer 130, bandpass filter 132, amplifier 134, phase splitter 137, I and Q mixers 136 and 138, amplifiers 140 and 142, bandpass filters 144 and 146, and RSSI 148. Signals are transmitted and received on antenna 124 and filtered by bandpass filter 122. Switch 120 connects power amplifier 118 through the bandpass filter 122 to the antenna 124 in the transmitted mode, and connects the input of the low noise amplifier 126 through the bandpass filter 122 to the antenna 124 in the receive mode.

In the transmit mode, an input signal and a second local oscillator signal are multiplied by mixer 102, the output of which is filtered by bandpass filter 104. The filtered output is gained by amplifier 106, which in turn drives phase splitter 108. The phase splitter 108 provides quadrature signals, which are amplified by amplifiers 110 and 112 and multiplied by I and Q components of a first local oscillator signal using mixers 114 and 116. The I and Q components are combined and received by power amplifier 118, and coupled through switch 120 to the bandpass filter 122 and onto antenna 124 for transmission.

In the receive mode, signals are received on antenna 124, filtered by bandpass filter 122, and coupled through switch 120 to the low noise amplifier 126. The output of the low noise amplifier drives bandpass filter 128, which in turn drives mixer 130. Mixer 130 multiplies or modulates the received signal with the first local oscillator signal, and provides a down converted intermediate frequency signal to bandpass filter 132. The output of the bandpass filter 132 drives amplifier 134, which in turn drives mixers 136 and 138. A second local oscillator signal is received by phase splitter 137, which provides quadrature outputs to the mixers 136 and 138. Mixers 136 and 138 down convert the I and Q signals to baseband, where they are amplified by amplifiers 140 and 142, and filtered by bandpass filters 144 and 146. These bandpass filters provide I and Q outputs typically to analog-to-digital converters, which provide quantized outputs to a digital signal processor.

Embodiments of the present invention may benefit by this circuit by being used as one or more of the included amplifiers. Alternately, amplifiers may be provided in other locations in this circuit. For example, an amplifier may be inserted between mixer 130 and bandpass filter 132. The implemented embodiment may vary depending on where in this circuit the embodiment is used.

Figure 2A:
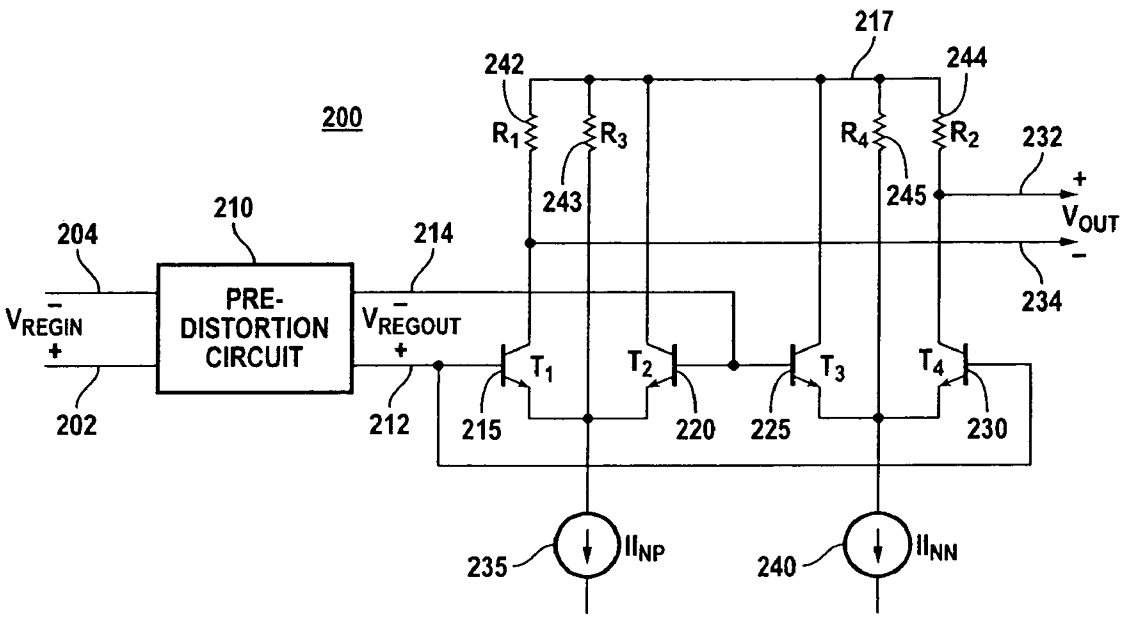
FIG. 2A is a schematic of a variable gain amplifier consistent with an embodiment of the present invention.

FIG. 2A is a schematic of a variable gain amplifier consistent with an embodiment of the present invention. Included are a pre-distortion circuit 210, a quad gain cell including transistors T1 215, T2 220, T3 225, and T4 230, load resistors R1 242 and R2 244, and DC bypass resistors R3 243 and R4 245.

The pre-distortion circuit 210 receives an input control signal VREGIN on one or more lines 202 and 204. This control signal may be a current or a voltage, and it may be single-ended, differential, or consistent with some other signaling scheme. The control input voltage VREGIN may be received from an off-chip or on-chip source. For example, a peak or area detector may be used to measure the signal level of VOUT on lines 232 and 234. This measurement may then be used to generate the control input voltage.

Input current sources IINP 235 and IINN 240 represent a differential input current. Often these currents are generated by a differential pair whose current is supplied by a current source. For example, a bipolar differential pair may be used. As can be seen, when the output of the pre-distortion circuit 210, VREGOUT on lines 212 and 214 increases, T1 215 and T4 230 conduct more current. This in turn increases the output VOUT on lines 232 and 234 for a given differential input current. Conversely, as the voltage VREGOUT decreases, T2 220 and T3 225 conduct more current, thus reducing the signal level at VOUT for a given differential in the current.

Figure 2B:
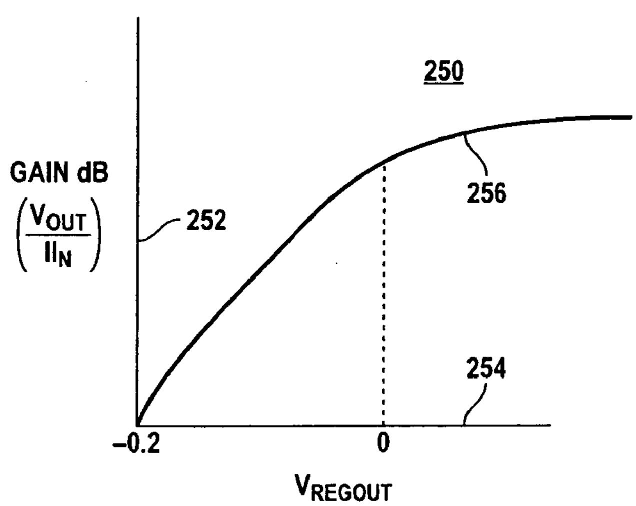
FIG. 2B illustrates a transfer function of gain as a function of input control voltage for a variable gain amplifier consistent with an embodiment of the present invention.

FIG. 2B illustrates a transfer function of the gain as a function of input control voltage VREGIN for an embodiment of the present invention. The transfer function 256 is plotted along a Y-axis 252 of gain in dB as a function of VREGOUT along linear X-axis 254. At a low control voltage, devices T1 215 and T4 230 are off. In this case, any differential current IINP 235 and IINN 240 flows directly VCC on line 217, and none flows through the output resistors R1 242 and R2 244. As the control voltage increases, transistors T1 215 and T4 230 begin to conduct. At this point the transfer characteristics of the gain as a function of the control voltage VREGOUT follows a relatively linear function when plotted in dB, as shown by curve 256. At some higher level of control voltage, devices T2 220 and T3 225 are no longer conducting, and the gain begins to flatten with increasing control voltage. In other embodiments, this gain stays linear for some amount of positive VREGOUT voltage. In a specific embodiment of the present invention, the gain at VREGOUT=0 is 20*log(R1)−6 dB, while the maximum gain is 20*log(R1).

The transfer function can be described by the equation:

$$Vout=[(IINP-IINN)*R]/[1+e\hat{}(-q*VREGOUT/kT) \qquad \text{Equation 1}$$

Where R is the value of R1 242 and R2 244, and T is absolute temperature. As can be seen, when the temperature and logarithmic (the "1" in the denominator) portions of Equation 1 are cancelled, the gain of quad cell depends only on the control voltage.

Figure 3:
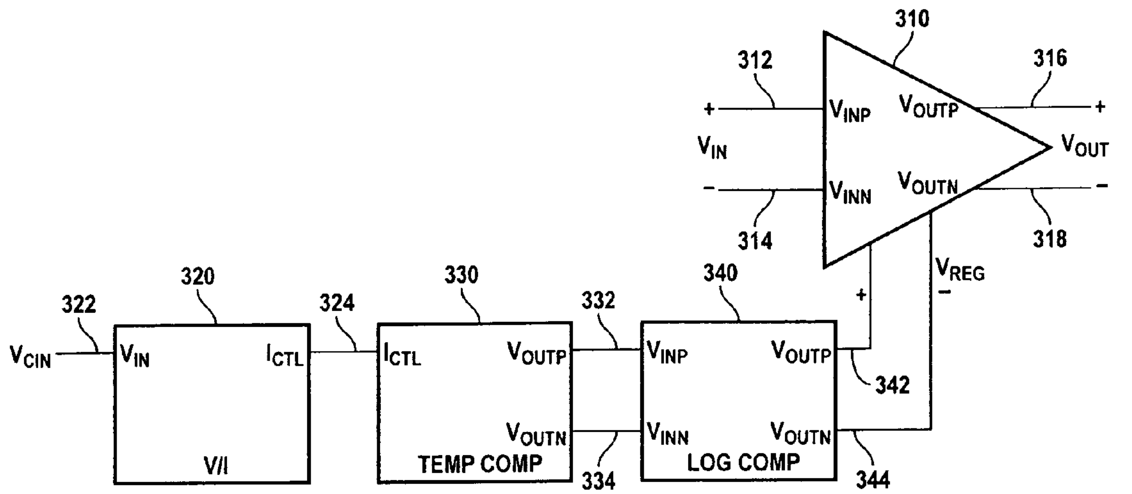
FIG. 3 is a block diagram of a variable gain amplifier and pre-distortion circuit consistent with an embodiment of the present invention.

FIG. 3 is a block diagram of a variable gain amplifier and pre-distortion circuit consistent with an embodiment of the present invention. In a specific embodiment of the present invention, this amplifier is formed on an integrated circuit. This integrated circuit may be fabricated using a bipolar, BiCMOS, silicon germanium, or other process. Included are a variable gain amplifier 310, voltage-to-current converter 320, temperature compensation circuit 330, and logarithmic compensation circuit 340. In this specific embodiment, the temperature compensation circuit provides an output to the logarithmic compensation circuit, though in other embodiments of the present invention the order of these circuit blocks can be reversed. Alternately, the temperature compensation and logarithmic compensation circuits may be in parallel such that their outputs are combined, by addition or otherwise, and provided to the variable gain amplifier 310.

The variable gain amplifier 310 receives an input voltage VIN on lines 312 and 314 and a gain control voltage VREG on lines 342 and 344, and provides an output voltage VOUT on lines 316 and 318. The gain of the variable gain amplifier, that is the output signal level divided by the input signal level depends on the signal level of the gain control voltage VREG. In a specific embodiment of the present invention, and increase in the gain control increases the gain from input to output for the variable gain amplifier 310. In this way, a consistent signal level at the output can be achieved despite changes in the input voltage.

Voltage-to-current converter 320 receives a gain control input voltage VCIN on line 322. Again, this control voltage may be generated on-chip or off-chip, for example by a circuit which detects the signal level at the output of the amplifier on lines 316 and 318. Alternately, the signal strength may be measured further downstream, for instance at a digital signal processing block, and a gain control signal could be generated from that information. Again, the gain control input voltage on line 322, as with the other signals shown in this and the other figures, may be single ended, differential, or consistent with another signaling scheme.

The voltage-to-current converter converts the control input voltage on line 322 to a current on line 324. This current is received by the temperature compensation circuit 330. The temperature compensation circuit converts the current received on line 324 to a current having a temperature coefficient such that the temperature coefficient of the gain of the variable gain amplifier 310 is reduced or eliminated. The temperature compensation circuit 330 provides an output voltage on lines 332 and 334.

The logarithmic compensation circuit 340 receives the temperature compensated signal on lines 332 and 334 from the temperature compensation circuit 330. The logarithmic compensation circuit 340 compensates for the non-logarithmic nature of the quad gain cell in the variable gain amplifier 310. The logarithmic compensation circuit provides the control voltage VREG on lines 342 and 344 to the variable gain amplifier 310.

Figure 4A:
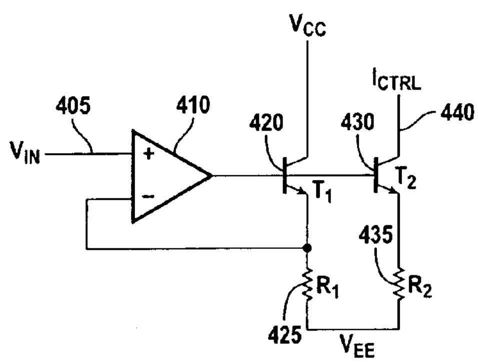

FIG. 4A is a schematic of a voltage-to-current converter that may be used as the voltage-to-current converter 320 in FIG. 3, or as a voltage-to-current converter in other embodiments of the present invention. Included are amplifier 410, reference transistor T1 1420 and its emitter degeneration resistor R1 425, and current source transistors T2 430 and its emitter degeneration resistor R2 435.

A control voltage is received by the amplifier 410 on line 405. The amplifier 410 adjusts the voltage at its output such that the emitter of the current source transistor T1 420 had a voltage that is approximately equal to the control input voltage on line 405. In this way, the control input voltage on line 405 is applied across resistor R1 425. This generates a current in T1 420 that is equal to the gain control voltage applied on line 405, divided by the resistor R1 425. This current is mirrored in transistor T2 430. For example, if devices T1 420 and T2 430, and resistors R1 425 and R2 435 match, the currents in T1 420 and T2 430 are approximately equal. Accordingly, a gain control voltage applied on line 405 is applied across resistor R1 425, mirrored to device T2 and output at its collector on line 440. In this way, the gain control voltage received on line 405 is converted to a current at the collector of T2 430.

Figure 4B:
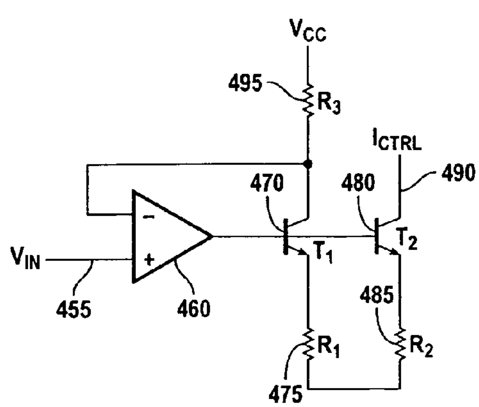

FIG. 4B is a schematic of any alternate voltage current converter it may be used as the voltage to current converter 320 and FIG. 3, or as a voltage to current converter and other embodiments of the present invention. Included are amplifier 460, current source transistors 470, emitter degeneration resistor R1 475, reference resistor R3 495, current source transistors T2 480, and emitter degeneration resistor R2 485.

Similar to the circuitry FIG. 4A, a gain control at the voltage is received on line 455 by the amplifier 460. The amplifier adjusts to voltage at the collector of T1 470 to be approximately equal to the gain control voltage on line 455. This gain control voltage is thus applied across resistor R3 495 thus generating a current in the collector of T1 470 that is approximately equal to the gain control voltage applied on line 455 divided by the resistor R3 495. It should be noted that in this specific example, the input voltage on line 455 is relative to the supply voltage VCC, as compared to the example shown FIG. 4A, where the control voltage received on line 405 is relative to the supply VEE or ground. The transistors T1 470 and T2 480 and resistors R1 475 and R2 485 form a current mirror to mirror the currents in R3 and provides it an output current on line 490.

Figure 4C:
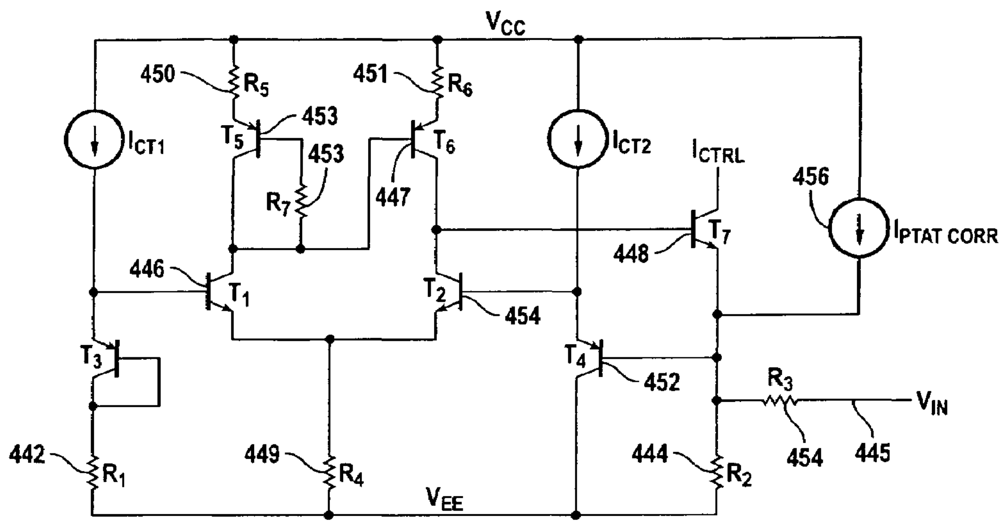
FIG. 4C is a schematic of a voltage-to-current converter used by a specific embodiment of the present invention.

FIG. 4C is a schematic of a voltage-to-current converter used by a specific embodiment of the present invention. A constant current through R1 442 sets the voltage across R2 444, which sets the output quiescent current ICTRL when the VIN pin is left open. This is accomplished by amplifier T1 446, T2 454, T5 453, T6 447, T7 448, R4 449, R5 450, and R6 451. T4 452 provides a level shift. R7 453 provides pnp beta compensation. The amplifier keeps the voltage at the emitter of T7 approximately constant, so if VIN is varied, the current flowing through R3 454 is transferred to ICTRL with a minus sign. IPTAT CORR is added to compensate for temperature drift. In the specific embodiment, this current is only a fraction of the current through R2 444.

Figure 5:
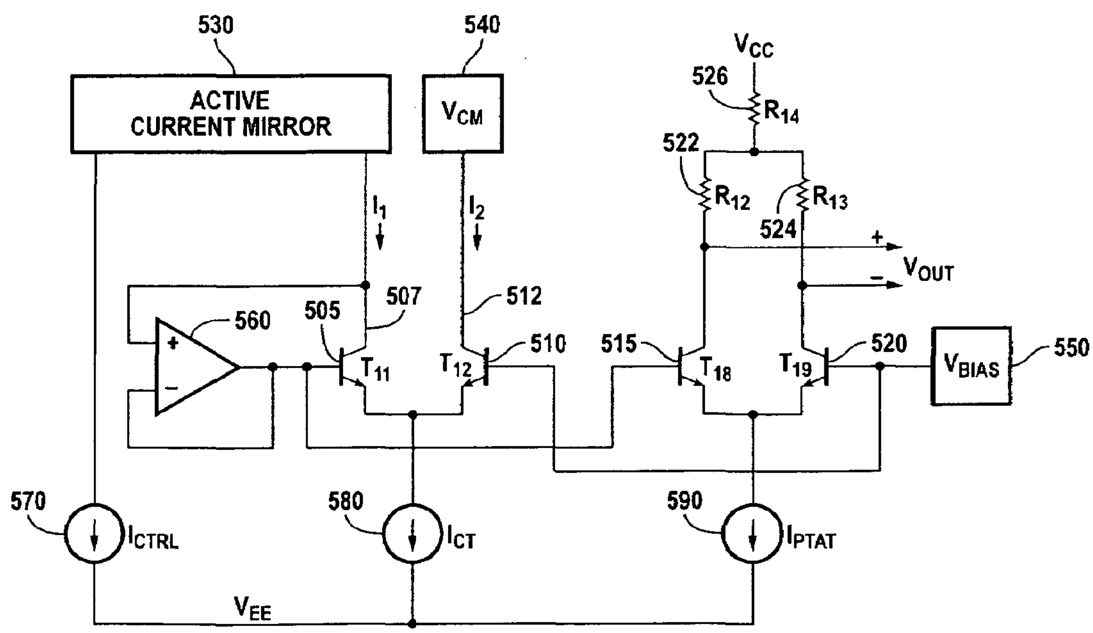
FIG. 5 is a schematic of a temperature compensation circuit that may be used as the temperature compensation circuit 330 in FIG. 3, or as a temperature compensation circuit in other embodiments of the present invention.

FIG. 5 is a schematic of a temperature compensation circuit that may be used as the temperature compensation circuit 330 in FIG. 3, or as a temperature compensation circuit in other embodiments of the present invention. Included are gain control current source 570, active current mirror 530, common-mode voltage circuit 540, buffer amplifier 560, bias circuit 550, constant with temperature current source ICT 580, and a proportional to absolute temperature current source IPTAT 590, differential pairs T11 505 and T12 510, and T18 515 and T19 520, load resistors R12 522 and R13 524, and level shift resistor R14 526.

Control current source 570 is generated by a circuit such as the circuits shown in FIGS. 4A and 4B, or other control current generating circuits. The current is mirrored by active current mirror 530, such that current I1 is approximately equal to or proportional to the control current of current source 570. Common-mode voltage circuit 540 generates a voltage at the collector of T12 510 that is approximately equal to the voltage at the collector of T11 505. This cancels the early voltage effects for transistors T11 505 and T12 510, thus improving the differential pair's power supply rejection.

Buffer 560 isolates the base of T11 505 from the current I1, such that the base currents of T11 505 and T18 515 do not reduce or subtract from its collector current. The bias generator 550 is optimally set for proper low voltage performance.

The first differential pair T11 505 and T12 510 is biased by a current that is constant with temperature, ICT 580. The second differential pair T18 515 and T19 520, is biased by a current that is proportional to absolute temperature, IPTAT 590. In this way, the control current 570, which is mirrored as I1 in the collector of T11 505, is multiplied by absolute temperature. Resistors R12 522 and R13 524 set the gain of the temperature compensation circuit, and thus the change in gain of the amplifier as a function of the input control voltage.

Figure 6:
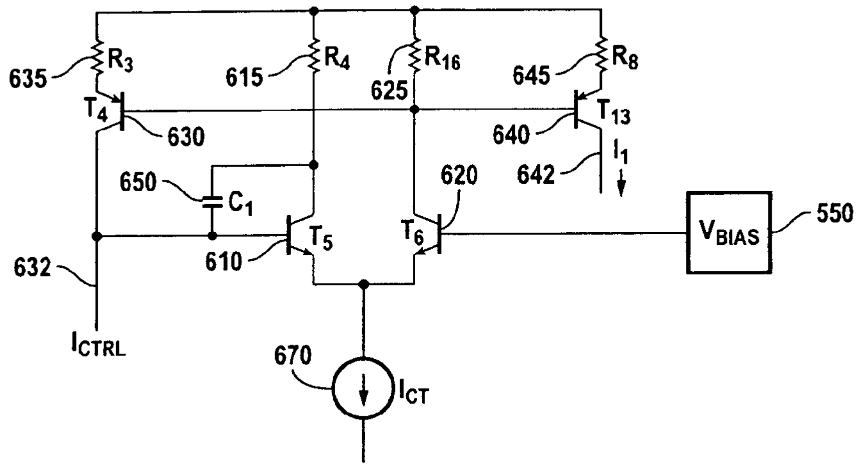
FIG. 6 is a schematic of an active current mirror that may be used as the active current mirror in FIG. 5, or as an active current mirror in other embodiments of the present invention.

FIG. 6 is a schematic of an active current mirror that may be used as the active current mirror 530 in FIG. 5, or as an active current mirror in other embodiments of the present invention. Included are pnp current mirror devices T4 630, T13 640, and their respective emitter degeneration resistors R3 635 and R8 645, differential pair T5 610 and T6 620, load resistor R16 625, current source ICT 670, compensation network C1 650 and R4 615, and bias generator 550.

The control current received on line 632 flows through device T4 630. T6 620 receives a bias voltage from the bias generator 550 at its base. The amplifier is configured in such a way that this voltage is replicated at the base of T5 610. The current present at T4 630 and its emitter degeneration resistor R3 635 is mirrored in device T13 640 and its emitter degeneration resistor R8 645. In this way, the control current received on line 632 is mirrored as current I1 642. Current I1 is approximately equal to or proportional to the control current received on line 632. For example, if device T13 640 and its emitter degeneration resistor R8 645 are scaled to be equal to transistor T4 630 and its emitter degeneration resistor R3 635, then I1 is approximately equal to the input control current.

This circuit provides efficient use of the available supply voltage since device T4 630 can be biased with a very low collector-to-emitter voltage while still buffering the base current of the device T4 630 from the control current received on line 632.

Figure 7:
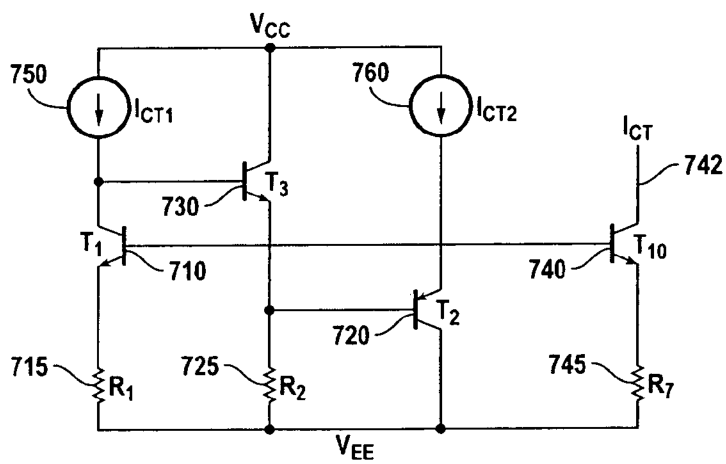
FIG. 7 is a schematic of a current mirror that may be used to mirror currents and act as the current sources in the included figures.

FIG. 7 is a schematic of a current mirror that may be used to mirror the constant with temperature current sources 670 in FIG. 6, or 580 in FIG. 5, or any of the other current sources shown in these figures, such as the proportional to absolute temperature current source 590 in FIG. 5. Included are first and second current sources 715 and 760, current mirror devices T1 710 and T10 740 and their emitter degeneration resistors R1 715 and R7 745, and a beta helper network including transistors T3 730, T2 720, and resistor R2 725.

The current to be mirrored it is the first constant with temperature current 750. Neglecting the base current of T3 730, this current flows in the collector of T1 710 and is mirrored as ICT on line 742 at the collector of TIO 740. As with the circuitry above, if T1 740 and R7 745 are scaled to be equal to devices T1 710 and R1 715, then the current ICT at the collector of T10 740 is approximately equal to the current in current source ICT1 750. Beta helper network T3 730, T2 720, and R2 725 provides a biasing that efficiently uses the available supply voltage, since device T1 710 is able to be biased with a zero-volt collector-to-base voltage while isolating the base current of T1 710 from the current to be mirrored.

Figure 8A:
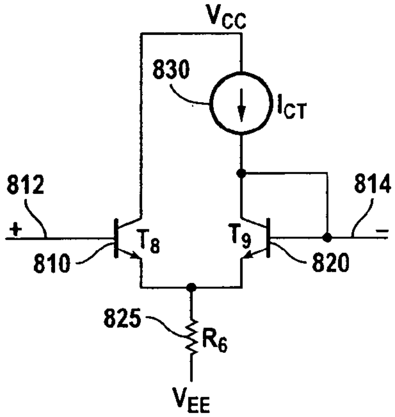

FIG. 8A is a schematic of the buffer amplifier that may be used as the buffer amplifier 560 in FIG. 5 or as a buffer amplifier in other embodiments of the present invention. Included are differential pair T8 810, T9 820, resistor R6 825, and current source 830.

Figure 8B:
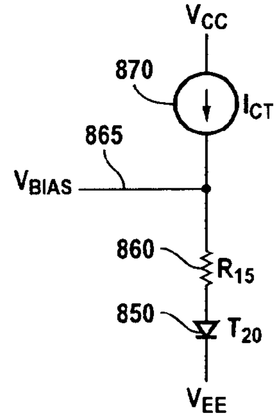
FIG. 8B is a schematic of a bias generator that may be used as the bias generator in FIGS. 5 and 6.

FIG. 8B is a schematic of a bias generator that may be used as the bias generator 550 in FIGS. 5 and 6. Included are a constant with temperature current source 870, and biasing resistor R15 860 and diode T2 850. T2 850 provides headroom for transistors such as T12 510 and T19 520 in FIG. 5 and T6 620 in FIG. 6. The resistor R15 860 increases the bias voltage on line 865, thus providing additional headroom for differential pair current sources such as ICT 580 and IPTAT 590 in FIG. 5, and ICT 670 in FIG. 6. In this way, a voltage which tracks the temperature coefficient of resistor R15 is provided as headroom for these current sources.

Figure 9:
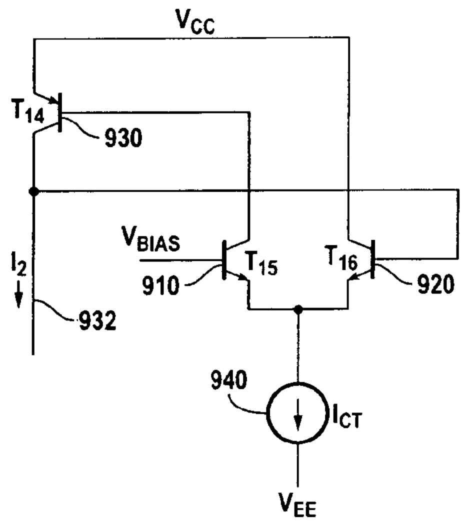
FIG. 9 is a schematic of a common-mode voltage generator that may be used as the common-mode voltage generator in FIG. 5, or as a common-mode voltage generator in other embodiments of the present invention.

FIG. 9 is a schematic of a common-mode voltage generator that may be used as the common-mode voltage generator 540 in FIG. 5, or as a common-mode voltage generator in other embodiments of the present invention. Included are differential pair T15 910 and T16 920, current source transistor T14 930, and current source 940.

Transistor T15 910 receives a bias voltage at its base, for instance from the bias generator 550 shown in the previous figures. The feedback is configured such that if the voltage at node 932 begins to drop, device T16 920 conducts less current. When this happens, device T15 910 begins to conduct more current, thereby increasing the base current and thus the collector current of device T14 930, which increases the voltage at node 932. In this way, the voltage at node 932 is set to be approximately equal to the bias voltage received at the base of T15 910.

Figure 10:
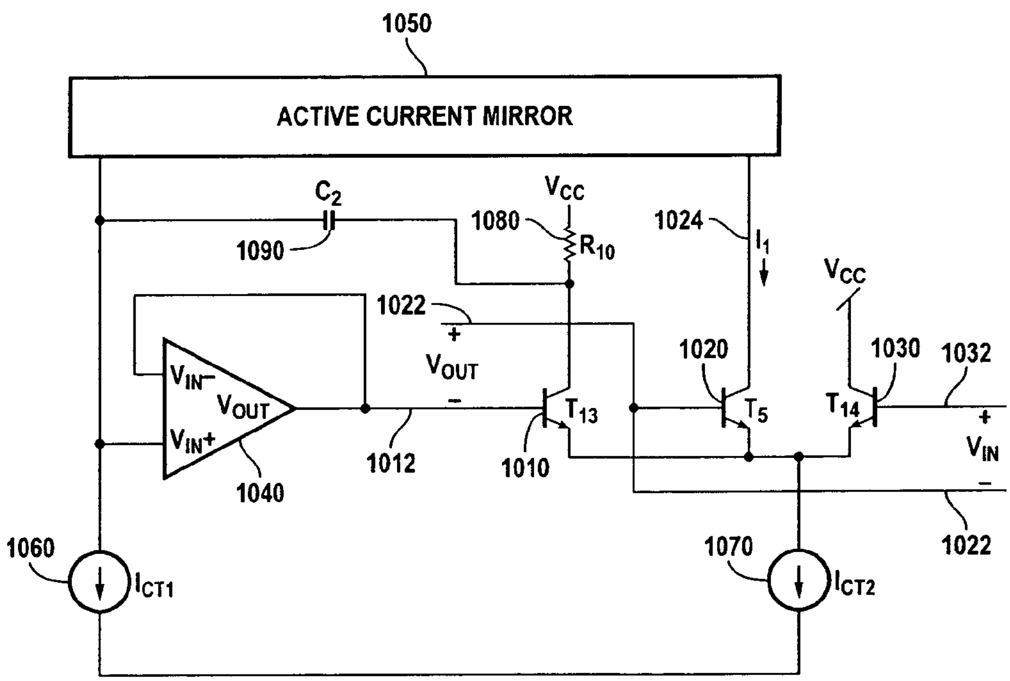
FIG. 10 is a schematic of a logarithmic compensation circuit that may be used as the logarithmic compensation circuit in FIG. 3, or as a logarithmic compensation circuit in other embodiments of the present invention.

FIG. 10 is a schematic of a logarithmic compensation circuit that may be used as the logarithmic compensation circuit 340 in FIG. 3, or as a logarithmic compensation circuit in other embodiments of the present invention. Included are current sources ICT1 1060 and ICT2 1070, buffer amplifier 1040, active current mirror 1050, transistors T13 1010, T5 1020, and T14 1030, and compensation network RIO 1080 and C2 1090.

The current provided by current source ICT1 1060 is mirrored by the active current mirror and provided to the collector of T5 1020. The output voltage from the temperature compensation circuit is received as VIN on lines 1032 and 1022. This input voltage is applied to the bases of T14 1030 and T5 1020. Accordingly, the current in the collector of T5 1020 is equal to I1 in line 1024 while the collector current of T14 1030 is a variable current that is a function of the output of the temperature compensation network.

Current source ICT2 1070 provides emitter currents for devices T13 1010, T5 1020, and T14 1030. Accordingly, the current in transistor T13 1010 is equal to the current in ICT2 1070 less the collector current of T5 1020 and T14 1030. That is, the collector current in transistor T13 1010 is a constant current, less a constant current minuses a variable current. The output voltage provided as the control voltage for the variable gain amplifier is taken between the bases of T5 1020 and T13 1010. In this way, the logarithmic term, the "1" in the denominator of equation 1, is removed from the overall transfer function.

Buffer 1040 provides a bias for the base of transistor T13 1010 and for the subsequent quad gain cell. The compensation for this loop is provided by capacitor C2 1090 and resistor R10 1080. Capacitor C2 1090 is Miller multiplied by the voltage gain around device T13 1010. Under conditions where transistor T13 1010 is lightly biased, its 1/Gm value is high, thus this voltage gain is low. At the same time however the gain provided by resistor RIO 1080 is also low, thus the Miller multiplication factor of capacitor C2 1090 is similarly low. Accordingly, when transistor T13 1010 is lightly biased, the loop gain is low, but the loop bandwidth remains high and the response time stays fast due to the smaller Miller multiplication of C2 1090, thus improving loop response time. When transistor T13 1010 conducts a larger current, the loop gain is higher, as is the Miller multiplication of capacitor C2, thus stabilizing the loop. Under these conditions the circuit remains stable as the loop gain is large, because the Miller multiplication of C2 1090 is larger. In this way, response time remains fast over varying bias conditions for transistor T3 1010.

Figure 11:
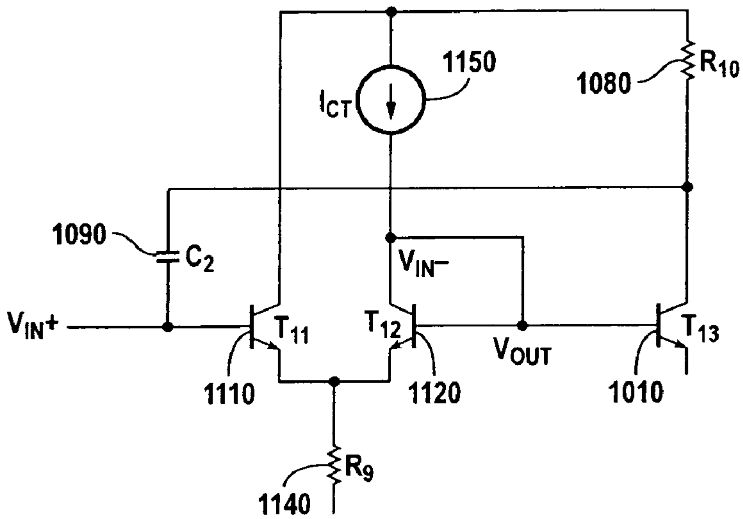
FIG. 11 is a schematic of a buffer amplifier that may be used as the buffer amplifier in FIG. 10, or as a buffer amplifier in other embodiments of the present invention.

FIG. 11 is a schematic of a buffer amplifier that may be used as the buffer amplifier 1040 in FIG. 10, or as a buffer amplifier in other embodiments of the present invention. Included are differential pair T11 1110 and T12 1120, current source resistor R9 1140, and current source ICT 1150. The transistor T13 1010 and compensation network including R10 1080 and C2 1090 are repeated from FIG. 10.

As the input voltage VIN at the base of T11 11110 increases, device T11 1110 conduct more of the current provided by resistor R9 1140. At the same time however, the collector current in T12 1120 is set to be equal to the current provided by current source ICT 1150. Accordingly the base of transistor T12 1120 also increases in voltage. In this way to voltage at the base of transistor T13 1010 follows the voltage at the base of transistor T11 1110.

Figure 12:
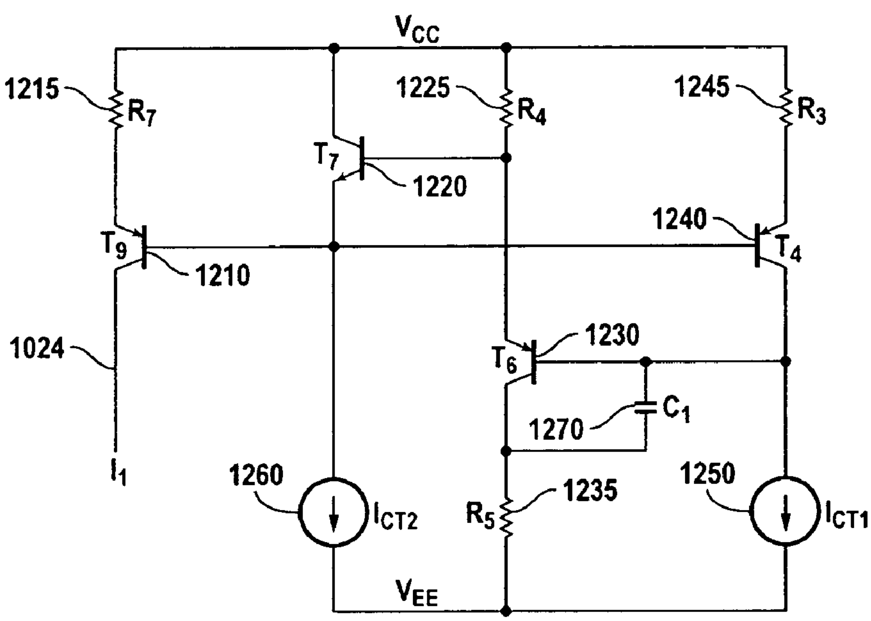
FIG. 12 is a schematic of an active current mirror that may be used as the active current mirror in FIG. 10 or as an active current mirror in other embodiments of the present invention.

FIG. 12 is a schematic of an active current mirror that may be used as the active current mirror 1050 in FIG. 10 or as an active current mirror in other embodiments of the present invention. Included are pnp current mirror devices T9 1210 and T4 1240 and their emitter degeneration resistors R7 1215 and R3 1245, beta helper network including T7 1220, R4 1225, R5 1235, and T6 1230, compensation capacitor C1 1270, and bias current source ICT2 1260.

The current ICT1 flows through transistor T4 1240, and is mirrored by transistor T9 1210. Specifically, if transistors T9 1210 and T4 1240 and their emitter degeneration resistors R7 1215 and R3 1245 are designed to be equal, the current I1 in line 1024 is approximately equal to the current provided by current source ICT1 1250. This configuration makes efficient use of the available supply voltage since the base-collector voltage of T4 1240 and is biased near zero volts, while the current ICT1 is isolated from its base.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A variable gain amplifier comprising:

a variable gain cell configured to receive an input signal and a gain control signal, and further configured to provide an output signal; and a pre-distortion circuit configured to receive a control input and to provide the gain control signal comprising:

a temperature compensation circuit configured to temperature compensate a first signal derived from the control input; and a logarithmic compensation circuit configured to logarithmically compensate a second signal derived from the control input, wherein the logarithmic compensation circuit changes the gain of the variable gain amplifier in decibels linearly, and wherein the temperature compensation circuit comprises a first differential pair and a second differential pair, and the first differential pair is coupled to a current mirror.

2. The variable gain amplifier of claim 1 wherein the first differential pair is biased by a temperature independent current source and the second differential pair is biased by a current source that is proportional to absolute temperature.

3. The variable gain amplifier of claim 2 wherein the logarithmic compensation circuit comprises a first device conducting a first current proportional to the first signal, a second device conducting a second current, and a third device conducting a third current that is equal to a fourth current less the first current and the second current.

4. The variable gain amplifier of claim 3 wherein the third device receives a base voltage from a compensation loop, and the loop bandwidth remains approximately constant for a wide range of the third current.

5. The variable gain amplifier of claim 4 wherein the first and second differential pairs, and the first, second, and third devices are formed by bipolar transistors.

6. The variable gain amplifier of claim 4 wherein the compensation loop comprises a buffer coupled to the third device, a resistor coupled to the third device, and a capacitor coupled to the resistor and the buffer.

7. A method of amplifying a signal comprising:

receiving a gain control signal;

converting the gain control signal to a first signal, the first signal temperature compensated;

converting the first signal to a second signal using a logarithmic compensation circuit, the second signal logarithmically compensated; and using the second signal to control the gain of a variable gain amplifier, wherein the logarithmic compensation circuit changes the gain of the variable gain amplifier in decibels linearly, wherein the gain control signal is converted to the first signal using a first differential pair and a second differential pair, wherein the first differential pair is biased by a temperature independent current source, the second differential pair is biased by a current source that is proportional to absolute temperature, and the first differential pair is coupled to a current mirror.

8. The method of claim 7 wherein the first signal is converted to the second signal using a logarithmic compensation circuit, wherein the logarithmic compensation circuit comprises a first device conducting a first current proportional to the first signal, a second device conducting a second current, and a third device conducting a third current that is equal to a fourth current less the first current and the second current.

9. The method of claim 8 wherein the third device receives a base voltage from a compensation loop, and the loop bandwidth remains approximately constant for a wide range of the third current.

10. The method of claim 9 wherein the first and second differential pairs, and the first, second, and third devices are formed by bipolar transistors.

11. The method of claim 9 wherein the compensation loop includes a buffer having an output coupled to the third device, a resistor coupled to the third device, and a capacitor coupled to the resistor and the buffer, and wherein the second signal is generated at the output of the buffer.

12. A method of amplifying a signal comprising:

receiving a gain control signal;

converting the gain control signal to a first signal using a logarithmic compensation circuit, the first signal logarithmically compensated;

converting the first signal to a second signal, the second signal temperature compensated; and using the second signal to control the gain of a variable gain amplifier, wherein the logarithmic compensation circuit changes the gain of the variable gain amplifier in decibels linearly, wherein the first signal is converted to the second signal using a first differential pair and a second differential pair, wherein the first differential pair is biased by a temperature independent current source, the second differential pair is biased by a current source that is proportional to absolute temperature, and the first differential pair is coupled to a current mirror.

13. The method of claim 12 wherein the gain control signal is converted to the first signal using a logarithmic compensation circuit, wherein the logarithmic compensation circuit comprises a first device conducting a first current proportional to the first signal, a second device conducting a second current, and a third device conducting a third current that is equal to a fourth current less the first current and the second current.

14. The method of claim 13 wherein the third device receives a base voltage from a compensation loop, and the loop bandwidth remains approximately constant for a wide range of the third current.

15. The method of claim 14 wherein the first and second differential pairs, and the first, second, and third devices are formed by bipolar transistors.

16. The method of claim 12 wherein the variable gain cell comprises a quad gain cell.

* * * * *